(12) United States Patent
Zhang

(10) Patent No.: US 10,426,039 B2
(45) Date of Patent: Sep. 24, 2019

(54) METHOD FOR STENCIL PRINTING DURING MANUFACTURE OF PRINTED CIRCUIT BOARD

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Xue-Qin Zhang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 465 days.

(21) Appl. No.: 15/075,445

(22) Filed: Mar. 21, 2016

(65) Prior Publication Data
US 2017/0150610 A1 May 25, 2017

(30) Foreign Application Priority Data
Nov. 20, 2015 (CN) .......................... 2015 1 0807431

(51) Int. Cl.
| | |
|---|---|
| H05K 3/40 | (2006.01) |
| H05K 3/12 | (2006.01) |
| H05K 3/00 | (2006.01) |
| H05K 3/24 | (2006.01) |
| H05K 3/42 | (2006.01) |
| H05K 13/08 | (2006.01) |

(52) U.S. Cl.
CPC ......... H05K 3/1225 (2013.01); H05K 3/0044 (2013.01); H05K 3/245 (2013.01); H05K 3/429 (2013.01); H05K 13/08 (2013.01); Y10T 29/49124 (2015.01); Y10T 29/49155 (2015.01)

(58) Field of Classification Search
CPC .... H05K 3/1225; H05K 3/0044; H05K 3/429; H05K 3/245; H05K 3/4644; H05K 3/46; H05K 13/08; Y10T 29/49155; Y10T 29/49124
USPC .................... 29/593, 705, 846–852
See application file for complete search history.

(56) References Cited

U.S. PATENT DOCUMENTS

| | | | | |
|---|---|---|---|---|
| 3,221,301 | A * | 11/1965 | Moyroud | ............... B41B 25/00 382/213 |
| 3,607,349 | A * | 9/1971 | Dereich | ............... C03C 17/326 427/266 |
| 3,668,028 | A * | 6/1972 | Short | .................... B41C 1/145 101/128.4 |

(Continued)

FOREIGN PATENT DOCUMENTS

| | | |
|---|---|---|
| CN | 1091233 A | 8/1994 |
| CN | 103660652 A | 3/2014 |
| CN | 103763854 A | 4/2014 |

Primary Examiner — Peter Dungba Vo
Assistant Examiner — Kaying Kue
(74) Attorney, Agent, or Firm — ScienBiziP, P.C.

(57) ABSTRACT

A method for stencil printing during manufacture of a printed circuit board includes forming a circuit diagram on a trepanned circuit board using a first stencil that has the circuit diagram, a scraper and conductive inks, forming a solder mask layer on the circuit board using a second stencil, the scraper, and solder materials, forming words and marks on the circuit board using a third stencil, the scraper, and inks, and forming a solder paste layer on the circuit board using a fourth stencil, the scraper, and solder paste.

5 Claims, 3 Drawing Sheets

(56) References Cited

U.S. PATENT DOCUMENTS

| | | | | | |
|---|---|---|---|---|---|
| 3,668,029 | A | * | 6/1972 | Blossick | C23F 1/02 216/100 |
| 3,720,986 | A | * | 3/1973 | Cranston | B23K 20/08 228/107 |
| 4,221,165 | A | * | 9/1980 | Ericsson | B41F 15/0813 101/126 |
| 4,263,341 | A | * | 4/1981 | Martyniak | H05K 1/09 174/256 |
| 4,610,200 | A | * | 9/1986 | Metso | B41F 15/10 101/126 |
| 4,715,278 | A | * | 12/1987 | Ericsson | B41F 15/46 101/123 |
| 4,813,352 | A | * | 3/1989 | Ericsson | B41F 15/0818 101/126 |
| 4,878,611 | A | * | 11/1989 | LoVasco | H05K 3/303 228/180.22 |
| 4,953,460 | A | * | 9/1990 | Wojcik | B41C 1/14 101/127 |
| 5,048,747 | A | * | 9/1991 | Clark | H05K 3/3484 228/180.21 |
| 5,203,706 | A | * | 4/1993 | Zamir | G09B 1/16 434/159 |
| 5,258,094 | A | * | 11/1993 | Furui | H05K 3/4614 216/18 |
| 5,263,243 | A | * | 11/1993 | Taneda | H05K 3/0035 156/89.18 |
| 5,460,316 | A | * | 10/1995 | Hefele | B41F 15/36 101/127 |
| 5,553,538 | A | * | 9/1996 | Freitag | B41F 15/0818 101/123 |
| 5,627,108 | A | * | 5/1997 | Alibocus | H05K 3/1225 156/277 |
| 5,716,663 | A | * | 2/1998 | Capote | B23K 35/0222 156/277 |
| 5,740,730 | A | * | 4/1998 | Thompson, Sr. | B41F 15/0818 101/115 |
| 5,808,259 | A | * | 9/1998 | Spinner | G01R 1/0408 219/56.22 |
| 5,947,021 | A | * | 9/1999 | Coleman | B41F 15/44 101/120 |
| 5,948,466 | A | * | 9/1999 | Sarashina | B41C 1/145 101/127 |
| 6,267,818 | B1 | * | 7/2001 | Volpe, Jr. | B41F 15/44 101/123 |
| 6,316,289 | B1 | * | 11/2001 | Chung | H01L 21/4867 257/E21.508 |
| 6,598,291 | B2 | * | 7/2003 | Parker, Jr. | H05K 3/4069 29/846 |
| 6,742,247 | B2 | * | 6/2004 | Pai | H05K 3/462 174/255 |
| 6,845,557 | B2 | * | 1/2005 | Miller | H01L 23/49822 174/262 |
| 9,743,527 | B2 | * | 8/2017 | Haugen | H05K 3/00 |
| 2002/0043395 | A1 | * | 4/2002 | Parker, Jr. | H05K 3/4069 174/250 |
| 2003/0062192 | A1 | * | 4/2003 | Pearson | H05K 1/0266 174/250 |
| 2004/0062896 | A1 | * | 4/2004 | Picone | B32B 7/06 428/40.1 |
| 2004/0118602 | A1 | * | 6/2004 | Lee | H05K 1/162 174/260 |
| 2004/0121266 | A1 | * | 6/2004 | Lee | H05K 1/162 430/313 |
| 2004/0183182 | A1 | * | 9/2004 | Swindlehurst | G06K 19/077 257/686 |
| 2005/0052326 | A1 | * | 3/2005 | Gundlach | C23C 2/02 343/733 |
| 2005/0058771 | A1 | * | 3/2005 | Herron | B41F 15/42 427/96.1 |
| 2005/0071996 | A1 | * | 4/2005 | Ray | H05K 3/1225 29/829 |
| 2007/0161223 | A1 | * | 7/2007 | Hu | H05K 3/243 438/613 |
| 2007/0186412 | A1 | * | 8/2007 | Hsu | H05K 1/112 29/830 |
| 2008/0016686 | A1 | * | 1/2008 | Lee | H05K 3/0014 29/846 |
| 2008/0081407 | A1 | * | 4/2008 | Oh | H01L 22/12 438/235 |
| 2008/0217046 | A1 | * | 9/2008 | Tang | H01L 23/49811 174/257 |
| 2008/0236881 | A1 | * | 10/2008 | Tanaka | H05K 1/0219 174/266 |
| 2009/0000814 | A1 | * | 1/2009 | Primavera | G01R 31/2805 174/266 |
| 2009/0081823 | A1 | * | 3/2009 | Meeus | B41M 3/006 438/98 |
| 2009/0159317 | A1 | * | 6/2009 | Zhang | H05K 3/4069 174/257 |
| 2009/0294958 | A1 | * | 12/2009 | Hu | H01L 23/3114 257/737 |
| 2009/0302485 | A1 | * | 12/2009 | Fan | H01L 23/13 257/780 |
| 2010/0122633 | A1 | * | 5/2010 | Doyle | H05K 13/0061 101/126 |
| 2010/0170621 | A1 | * | 7/2010 | Shnaps | B41F 15/36 156/93 |
| 2011/0056910 | A1 | * | 3/2011 | Kato | C23F 1/18 216/41 |
| 2011/0156237 | A1 | * | 6/2011 | Gulpen | H01L 21/568 257/692 |
| 2011/0192296 | A1 | * | 8/2011 | Kim | H05K 3/1225 101/127.1 |
| 2012/0198977 | A1 | * | 8/2012 | Roick | B23K 3/0638 83/39 |
| 2013/0228221 | A1 | * | 9/2013 | Moslehi | H01L 31/022441 136/256 |
| 2014/0224018 | A1 | * | 8/2014 | Whitesides | G01P 15/0802 73/514.33 |
| 2014/0248443 | A1 | * | 9/2014 | Eder | B41N 1/247 427/569 |
| 2014/0284080 | A1 | * | 9/2014 | Zhang | H05K 3/1233 174/250 |
| 2014/0378072 | A1 | * | 12/2014 | Waldvogel | H04B 1/40 455/73 |
| 2015/0045927 | A1 | * | 2/2015 | Haugen | H05K 3/00 700/109 |

* cited by examiner

METHOD FOR STENCIL PRINTING DURING MANUFACTURE OF PRINTED CIRCUIT BOARD

CROSS-REFERENCE TO RELATED APPLICATIONS

This application claims priority to Chinese Patent Application No. 201510807431.3 filed on Nov. 20, 2015, the contents of which are incorporated by reference herein.

FIELD

The subject matter herein generally relates to printed circuit board manufacture, and particularly to a method for stencil printing during manufacture of a printed circuit board.

BACKGROUND

In a traditional process of manufacturing printed circuit board, steps of copper deposition, circuit diagram transfer, circuit diagram electroplating, film stripping, etching, tin stripping, solder resist pattern transfer, and tin deposition are usually included.

DETAILED DESCRIPTION

Figure 1:
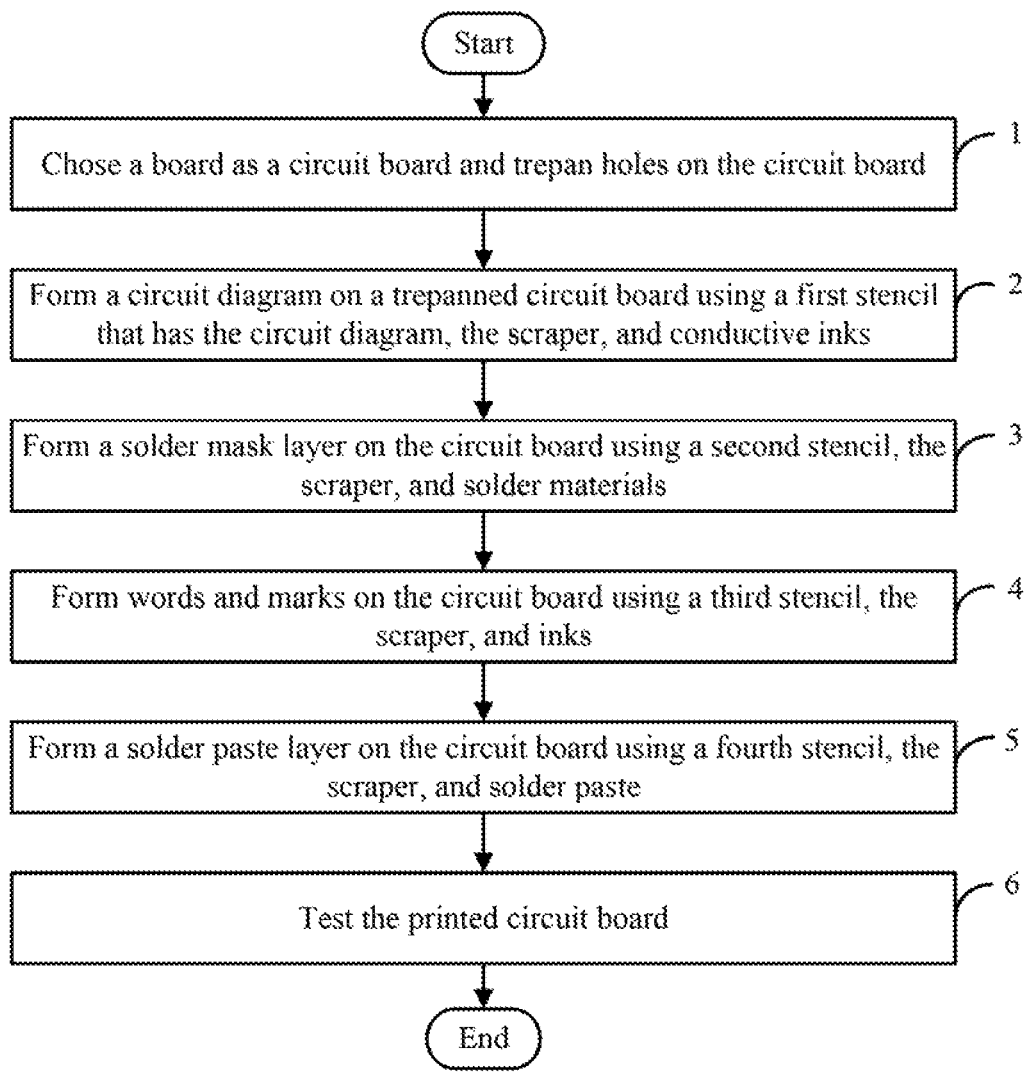
FIG. 1 illustrates a flowchart of a method for stencil printing during manufacture of a printed circuit board of one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts can be exaggerated to better illustrate details and features. The description is not to be considered as limiting the scope of the embodiments described herein.

FIG. 1 illustrates a flowchart of a method for stencil printing during manufacture of a printed circuit board. In the illustrated embodiment, the circuit board is printed by use of a number of stencils, a scraper, printing materials, and other steps. The stencil includes a silkscreen, a steel disc, and a frame. The silkscreen is pasted on the steel disc by bonding glues. The steel disc is made from stainless steel. In the illustrated embodiment, the steel disc can be trepanned by means of laser cutting, chemical etching, or electroforming. The frame is used for fixing the silkscreen and the steel disc. The scraper is made from rubber material, and is used for scraping some printing materials on and over the stencils.

In the illustrated embodiment, the stencil has a predetermined thickness for reasons of printing the printing materials on a designated area of the circuit board, wherein the predetermined thickness is in a range from 0.1 millimeter to 0.3 millimeters. The silkscreen of the stencil includes a number of meshes, and the printing materials can pass through the meshes of the silkscreen, thus the scraper can scrape the printing material onto the circuit through the meshes corresponding to trepanned holes.

As illustrated in FIG. 1, the method is provided by way of example, as there are a variety of ways to carry out the method. Each block shown in FIG. 1 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 1.

At block 1, a board is chosen as a circuit board and holes are trepanned on the circuit board.

At block 2, a circuit diagram is formed on the trepanned circuit board using a first stencil, the scraper, and conductive inks.

In the illustrated embodiment, the holes corresponding to the circuit diagram are trepanned on the first stencil. The first stencil having the circuit diagram is fixed on the trepanned circuit board, wherein the holes are aligned to an area where a circuit diagram is to be formed on the circuit board. The conductive inks are put on one end of the first stencil. The scraper moves the conductive inks around between the end having the conductive inks and the other end. The conductive inks are extruded to the circuit board from the holes of the first stencil by the scraper, thereby the circuit diagram is formed on the circuit board.

In the illustrated embodiment, the scraper moves around repeatedly to distribute the conductive inks uniformly on the circuit diagram area of the circuit board. When the circuit diagram is formed on the circuit board, the scraper is cleaned prior to being reused. In the illustrated embodiment, the conductive inks are a type of pasty inks with conductive materials, such as gold, silver, copper, or carbon.

At block 3, a solder mask layer is formed on the circuit board using a second stencil, the scraper, and solder materials.

In the illustrated embodiment, the holes corresponding to the solder mask layer are trepanned on the second stencil. The second stencil is fixed on the circuit board, wherein the holes on the second stencil are aligned to an area where a solder mask layer is to be formed on the circuit board. The solder materials are put on one end of the second stencil. The scraper moves the solder materials around between the end having the solder materials and the other end. The solder materials are extruded to the circuit board from the holes of the second stencil by the scraper, thereby the solder mask layer is formed on the circuit board.

When the solder mask layer is formed on the circuit board, the scraper is cleaned prior to being reused. In the illustrated embodiment, the solder materials can be green solder resists, blue solder resists, or red solder resists.

At block 4, words and marks are formed on the circuit board using a third stencil, the scraper, and inks.

In the illustrated embodiment, the holes corresponding to the words and marks are trepanned on the third stencil. The third stencil is fixed on the circuit board, wherein the holes on the third stencil are aligned to an area or areas on which the words and marks are to be formed on the circuit board. The inks are put on one end of the third stencil. The scraper moves the inks around between the end having the inks and the other end. The inks are extruded to the circuit board from the holes of the third stencil by the scraper, thereby the words and marks are formed on the circuit board.

When the words and marks are formed on the circuit board, the scraper is cleaned prior to being reused. In the illustrated embodiment, the inks are thermosetting inks.

At block 5, a solder paste layer is formed on the circuit board using a fourth stencil, the scraper, and solder paste.

In the illustrated embodiment, the holes corresponding to the solder paste layer are trepanned on the fourth stencil. The fourth stencil is fixed on the circuit board, wherein the holes on the fourth stencil are aligned to an area where the solder paste layer is to be formed on the circuit board. The solder paste is put on one end of the fourth stencil. The scraper moves the solder paste around between the end having the solder paste and the other end. The solder paste is extruded to the circuit board from the holes of the fourth stencil by the scraper, thereby the solder paste layer is formed on the circuit board. When the solder paste layer is formed on the circuit board, the scraper is cleaned prior to being reused.

At block 6, the printed circuit board is tested.

In the illustrated embodiment, the printed circuit board test includes electrical testing and visual inspection. The electrical testing checks whether an open circuit or a short circuit exists, and the visual inspection checks the appearance of the printed circuit board.

Figure 2:
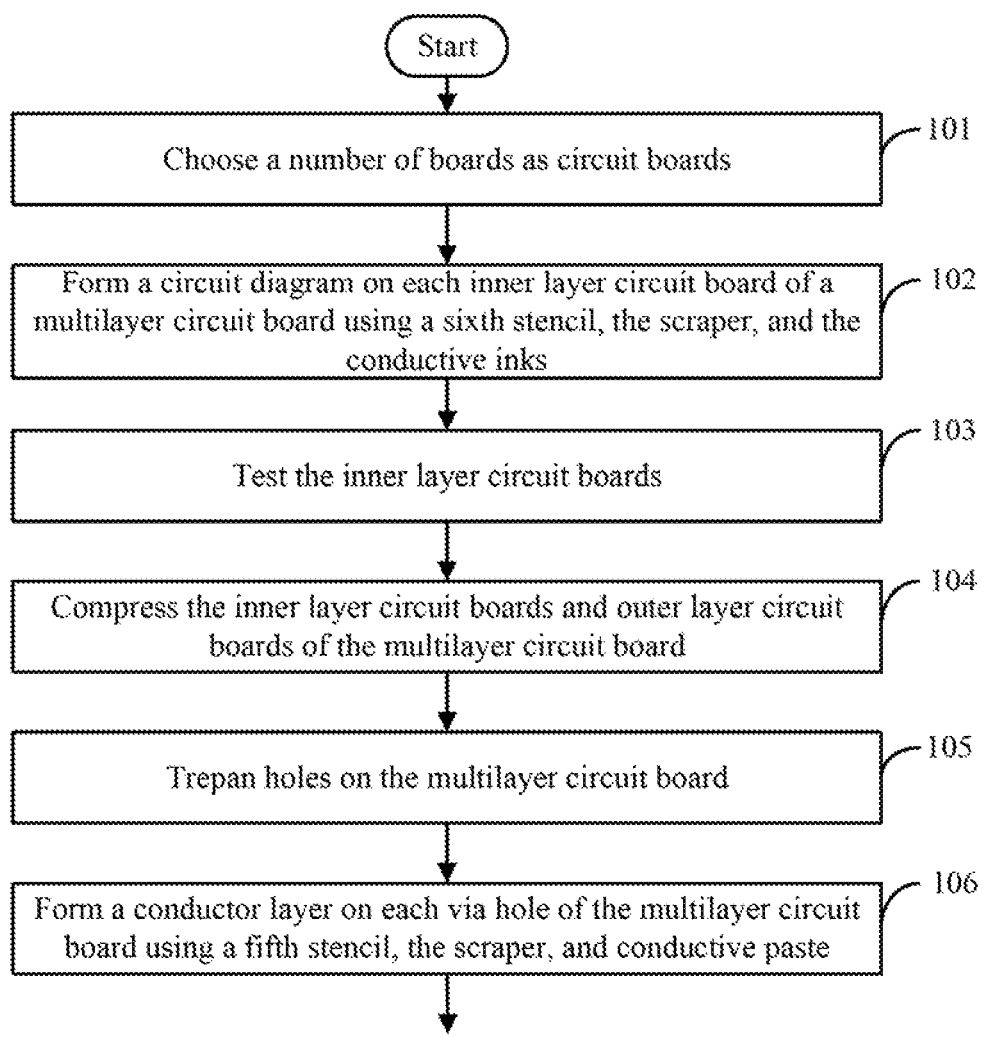
FIGS. 2-3 illustrate a flowchart of a method for stencil printing during manufacture of a multilayer printed circuit board of one embodiment.
Figure 3:
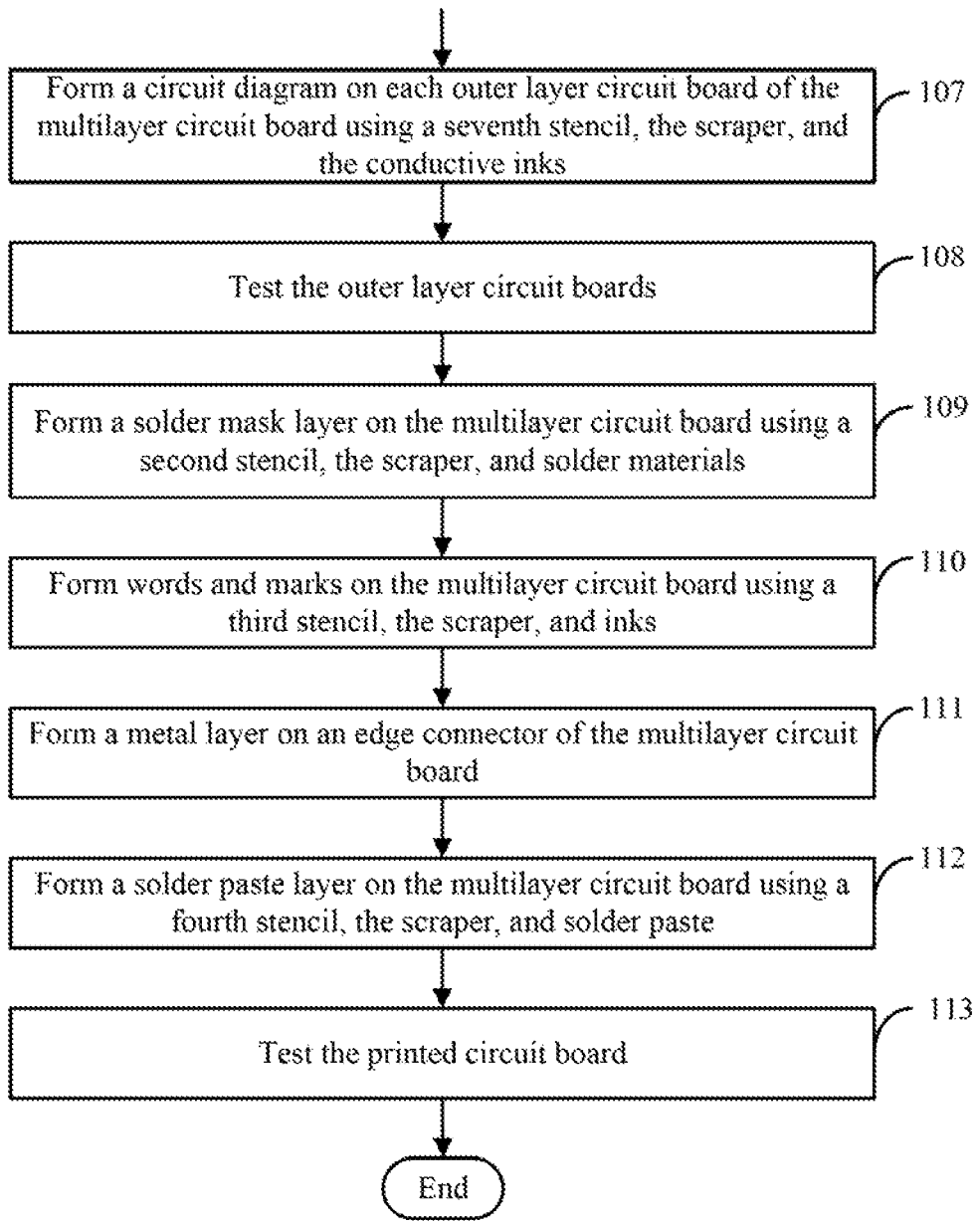

FIG. 2 and FIG. 3 illustrate a flowchart of a method for stencil printing during manufacture of a multilayer printed circuit board. The method is provided by way of example, as there are a variety of ways to carry out the method. Each block shown in FIG. 2 and FIG. 3 represents one or more processes, methods, or subroutines carried out in the example method. Furthermore, the illustrated order of blocks is by example only and the order of the blocks can be changed. Additional blocks may be added or fewer blocks may be utilized, without departing from this disclosure.

At block 101, a number of boards are chosen as circuit boards.

At block 102, a circuit diagram is formed on each inner layer circuit board of the multilayer circuit board using a sixth stencil, the scraper, and the conductive inks. In the illustrated embodiment, the holes corresponding to the circuit diagram are trepanned on the sixth stencil.

At block 103, when the circuit diagram is formed on each inner layer circuit boards, the inner layer circuit boards are tested.

At block 104, the inner layer circuit boards and outer layer circuit boards of the multilayer circuit board are compressed.

At block 105, holes are trepanned on the multilayer circuit board. In the illustrated embodiment, the trepanned holes include location holes and via holes.

At block 106, a conductor layer is formed on each via hole of the multilayer circuit board using a fifth stencil, the scraper, and conductive paste.

In the illustrated embodiment, the holes corresponding to the via holes are trepanned on the fifth stencil. The fifth stencil is fixed on the circuit board, wherein the holes on the fifth stencil are aligned to the via holes to be formed the conductor layer on the circuit board. The conductive paste is put on one end of the fifth stencil. The scraper moves the conductive paste around between the end having the conductive paste and the other end. The conductive paste is extruded to the via holes of the circuit board from the holes of the fifth stencil by the scraper, thereby the conductor layer is formed in each via hole when the conductive paste solidifies.

When the conductor layer is formed in each via hole of the circuit board, the scraper is cleaned prior to being reused. In the illustrated embodiment, the conductive paste can be silver paste, copper paste, or carbon paste.

At block 107, a circuit diagram is formed on each outer layer circuit board of the multilayer circuit board using a seventh stencil, the scraper, and the conductive inks. In the illustrated embodiment, the holes corresponding to the circuit diagram are trepanned on the seventh stencil.

At block 108, when the circuit diagram is formed on each outer layer circuit board, the outer layer circuit boards are tested.

At block 109, a solder mask layer is formed on the multilayer circuit board using a second stencil, the scraper, and solder materials.

At block 110, words and marks are formed on the multilayer circuit board using a third stencil, the scraper, and inks.

At block 111, a metal layer is formed on an edge connector of the multilayer circuit board. In the illustrated embodiment, the metal layer is nickel and/or gold.

At block 112, a solder paste layer is formed on the multilayer circuit board using a fourth stencil, the scraper, and solder paste.

At block 113, the printed circuit board is tested.

In the process of manufacturing the printed circuit board using the stencil printing method, steps of copper deposition, circuit diagram transfer, circuit diagram electroplating, film stripping, etching, tin striping, solder resist pattern transfer, and tin deposition are avoided, thus less time is spent for manufacturing the printed circuit board. At the same time, less pollution is generated during manufacture of such printed circuit board.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A method for stencil printing during manufacture of a multilayer printed circuit board, comprising:

positioning a first stencil having a circuit diagram onto a circuit board, wherein the first stencil comprises a silkscreen, a steel disc, and a frame, the silkscreen is pasted on the steel disc, the frame fastens the silkscreen and the steel disc, applying conductive inks onto the first stencil through meshes of the silkscreen and trepanned holes of the steel disc using a scraper, thereby forming the circuit diagram on the circuit board;

applying solder materials on a second stencil disposed on the circuit board using the scraper, thereby forming a solder mask layer on the circuit board;

applying inks on a third stencil disposed on the circuit board using the scraper, thereby forming words and marks on the circuit board; and applying solder paste on a fourth stencil disposed on the circuit board using the scraper, thereby forming a solder paste layer on the circuit board;

after applications of the first stencil, the second stencil, the third stencil, and the fourth stencil, compressing two of the circuit board to form the multilayer printed circuit board;

trepanning holes on the multilayer printed circuit board; and applying conductive paste on a fifth stencil disposed on the multilayer printed circuit board using the scraper, thereby forming a conductor layer in each via hole on the multilayer printed circuit board, wherein each of the first stencil, the second stencil, the third stencil, the fourth stencil, and the fifth stencils are different from each other.

2. The method according to claim 1, wherein the conductive paste are silver paste, copper paste, or carbon paste.

3. The method according to claim 1, further comprising:
testing each of the circuit board before compressing into the multilayer printed circuit board.

4. The method according to claim 1, further comprising:
forming a metal layer on an edge connector of the multilayer printed circuit board.

5. The method according to claim 4, wherein the metal layer is nickel, gold, or an alloy thereof.

* * * * *